USOO6851493B2

United States Patent
Staszewski et al.

(10) Patent No.: US 6,851,493 B2
(45) Date of Patent: Feb. 8, 2005

(54) DIGITAL PLL WITH GEAR SHIFT

(75) Inventors: Robert B. Staszewski, Garland, TX (US); Kenneth J. Maggio, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 760 days.

(21) Appl. No.: 09/728,180

(22) Filed: Dec. 1, 2000

(65) Prior Publication Data

US 2002/0094052 A1 Jul. 18, 2002

(51) Int. Cl.$^7$ ................................................ H03D 3/24
(52) U.S. Cl. ..................................................... 175/376
(58) Field of Search ................................. 375/376, 371, 375/372, 354, 327; 329/325, 360; 327/147, 156; 331/1 A, 17

(56) References Cited

U.S. PATENT DOCUMENTS

| 5,369,376 A | 11/1994 | Leblebicioglu |
| 5,821,817 A | 10/1998 | McCorkle |
| 6,018,556 A | 1/2000 | Janesch et al. |
| 6,157,271 A | * 12/2000 | Black et al. ................. 332/127 |
| 6,192,088 B1 | * 2/2001 | Aman et al. ................. 375/326 |
| 6,532,271 B1 | * 3/2003 | Hwang et al. .............. 375/326 |
| 6,587,529 B1 | * 7/2003 | Staszewski et al. ......... 375/371 |
| 6,732,286 B1 | * 5/2004 | Sutardja ..................... 713/400 |

FOREIGN PATENT DOCUMENTS

| EP | 0 805 560 A | 5/1997 |
| WO | WO 99/18670 A | 4/1999 |

* cited by examiner

*Primary Examiner*—Khai Tran
(74) *Attorney, Agent, or Firm*—Ronald O. Neerings; Wade James Brady, III; Frederick J. Telecky, Jr.

(57) ABSTRACT

A PLL synthesizer (100) includes a gear-shifting scheme of the PLL loop gain constant, α. During frequency/phase acquisition, a larger loop gain constant, $α_1$ is used such that the resulting phase error is within limits. After the frequency/phase gets acquired, the developed phase error, which is a rough indication of the frequency offset is in a steady-state condition. While transitioning into the tracking mode, the DC offset is added to the DCO tuning signal preferably the DC offset is added to the phase error signal and the loop constant is reduced from $α_1$ to $α_2$. This scheme provides for hitless operation, while requiring a low dynamic range of the phase detector (101).

17 Claims, 2 Drawing Sheets

«DIGITAL PLL WITH GEAR SHIFT»

TECHNICAL FIELD

This invention relates in general to phase-locked loop (PLL) circuits, more specifically to a digital phase-locked-loop (PLL) and PLL synthesizer having an adjustable loop gain constant, and a method for adjusting the loop gain constant of a PLL.

BACKGROUND

High bandwidth PLL loops are usually built as type I PLLs, which inherently feature faster loop dynamics. A type I PLL uses only one integrating pole due to the voltage-controlled-oscillator (VCO) frequency-to-phase conversion and, consequently, there is no filtering of the phase error signal. This is important if fast frequency/phase acquisition is required. However, unlike in type II PLL loops, where the steady-state phase error goes to zero in the face of a constant frequency offset (i.e., frequency deviation between the actual and center VCO frequencies), the phase error in type I PLL loops is proportional to the frequency offset. This effectively limits the dynamic range of the phase detector or the maximum operational frequency range of the VCO (or of a digitally-controlled oscillator, DCO) in a type I PLL. This dynamic-range limitation problem is also extended to higher-order digital PLL loops. The loop filter (LF), normally containing an integrating capacitor in analog PLL implementations or an integrator in digital PLL implementations, outputs a "filtered phase error" signal which is roughly proportional to the frequency offset. A need thus exists in the art for a PLL loop that provides for fast frequency/phase acquisition, while minimizing the impact to the dynamic range or the maximum range of a VCO/DCO operational frequency.

BRIEF DESCRIPTION OF THE DRAWINGS

The features of the present invention, which are believed to be novel, are set forth with particularity in the appended claims. The invention, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
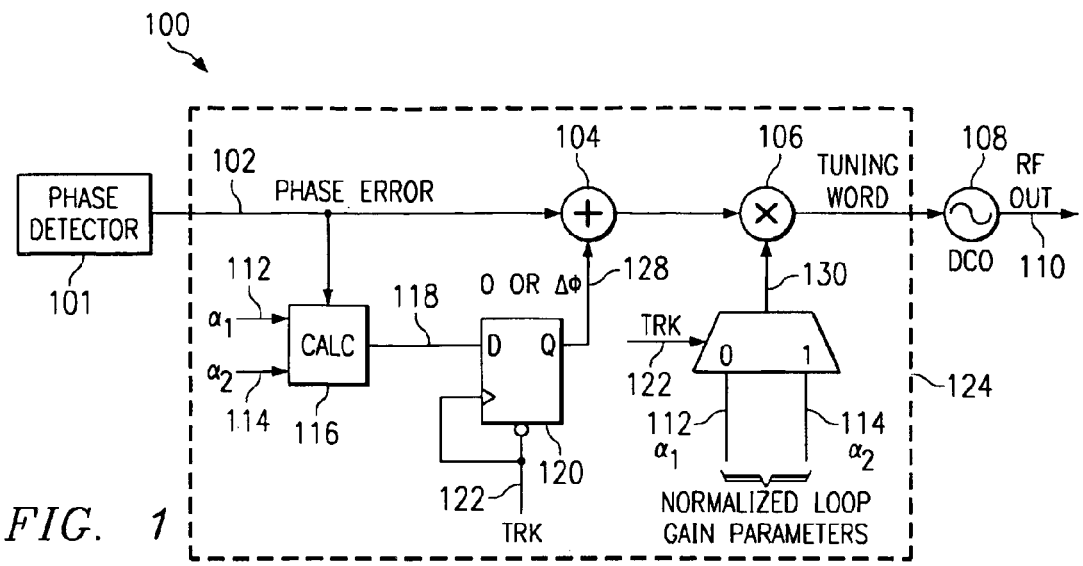
FIG. 1 shows a block diagram of a portion of a type I digital PLL synthesizer in accordance with the invention.

While the specification concludes with claims defining the features of the invention that are regarded as novel, it is believed that the invention will be better understood from a consideration of the following description in conjunction with the drawing figures, in which like reference numerals are carried forward.

The solution to the above noted problem is solved in the present invention by introducing a "gear-shift" adjustment to the PLL's loop gain constant, "α". During frequency/phase acquisition, a larger loop gain constant, $α_1$, is used such that the resulting phase error is within limits. After the frequency/phase is acquired, the developed phase error, which is a rough indication of the frequency offset, is in a steady-state condition. The following two operations are performed simultaneously (during the same clock cycle) while transitioning into the tracking mode:

1. Add the DC offset to the VCO tuning signal, and
2. Reduce the loop constant from $α_1$ to $α_2$, where $α_2 < α_1$.

Since (1) above results in substantial lowering of the maximum phase error, α can then be safely reduced in (2) above. It should be noted that in a type I PLL loop, the frequency deviation is directly proportional to the phase error and the loop gain constant, α.

The present invention is fully digital and provides an exact hitless operation, while requiring a low dynamic range of the phase detector. It provides for a hitless gear shifting mechanism of a PLL loop, without requiring a large dynamic range of the phase error. Moreover, it is a prefect match for use in digital PLL loop synthesizer, etc.

Figure 2:
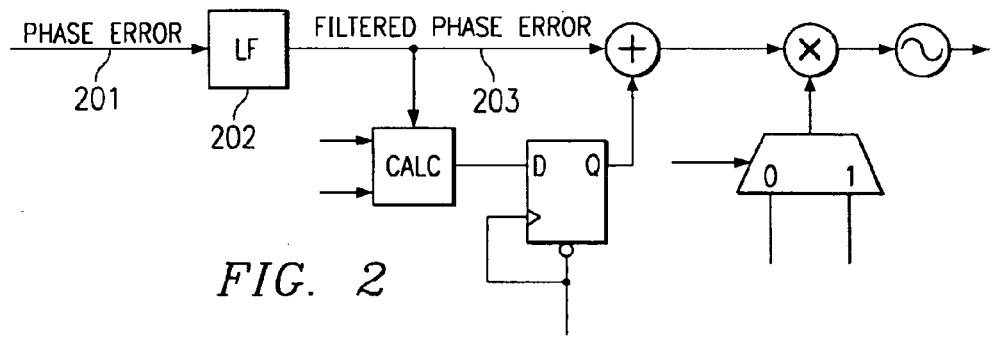
FIG. 2 shows a portion of a higher-order digital PLL synthesizer in accordance with the invention.

Referring now to FIG. 1, there is shown a simplified block diagram of a portion of an all-digital PLL (ADPLL) synthesizer circuit 100. The conventional PLL feedback loop has not been shown in FIGS. 1 and 2 in order to concentrate the discussion on the present invention. The ADPLL portion of the present invention can be contained within DCO gain block 124. Circuit 100 specifically pertains to a type I PLL loop, with only one pole due to the frequency-to-phase conversion of the oscillator. The phase error signal [φ(k)] 102 of the phase detector 101 is used to drive the tuning input of the digitally controlled oscillator (DCO) 108 without any additional filtering operation. The gear shifting method of the present invention is also applicable to higher-order PLL loops. In that case, the "phase error" input signal becomes a "filtered phase error" signal 203 as shown in FIG. 2 coming from the output of loop filter (LF) 202. DCO 108 can be a DCO as described in U.S. Provisional patent application Ser. No. 60/186,452, entitled Digitally-Controlled VCO, by Robert B. Staszewski and Dirk Leipold, filed Mar. 2, 2000 and U.S. patent application Ser. No. 60/186,452 and the corresponding U.S. Non-provisional U.S. patent application, entitled Digitally-Controlled L-C Oscillator, docket no. TI-30695, by Robert B. Staszewski and Dirk Leipold, filed Oct. 5, 2000 based on the previously mentioned application, both of which are incorporated by reference herein in their entirety. DCO 108 can receive a digital input word from a digital PLL such as the digital PLL described herein and in U.S. patent application Ser. No. 09/603,023, entitled Digital Phase-Domain PLL Frequency Synthesizer, by Robert B. Staszewski and Dirk Leipold, filed Jun. 26, 2000, and that is incorporated by reference herein in its entirety.

All signals in FIG. 1 and FIG. 2, with the possible exception of the oscillator RF output 110 and the corresponding RF output of circuit 200, are digital. An asynchronous flip-flop 120 is controlled by a tracking control signal (TRK) 122. The TRK signal 122 is preferably provided by a controller (not shown) such as microprocessor, digital-signal processor, etc. that controls when the PLL is in the acquisition and tracking modes. For example, in a radio design that incorporates the present invention, the radio's controller could provide the TRK signal 122 once the PLL entered the tracking mode.

The flip-flop block 120 is a short-handed notation for a latching mechanism of the Δφ phase error adjustment. In practice, it would be preferably implemented as a state machine with a synchronous reset that stores a new $\Delta\phi$ value into a cleared register upon transition from the PLL acquisition to the PLL tracking mode.

During the frequency/phase acquisition mode, the circuit 100 shown in FIG. 1 operates under the high loop bandwidth regime that is controlled by the normalized loop gain $\alpha_1$ 112. Just before the gear shift instance, the phase error has a value of $\phi_1$. At the "gear-shift" switching instance when the PLL moves from the frequency/phase acquisition mode to the tracking mode, the new phase error value $\phi_2=\phi_1+\Delta\phi$ is adjusted for the new lower tracking-mode loop gain value $\alpha_2$ 114 such that there is no frequency perturbation of the oscillator 108 before and after the event as shown by the following equation 1:

$$\alpha_1 \cdot \phi_1 = \alpha_2(\phi_1 + \Delta\phi) \qquad \text{Equation 1}$$

The required phase error adjustment value $\Delta\phi$ 118 of Equation 2 below is derived from Equation 1, as follows:

$$\Delta\phi = \frac{\alpha_1 - \alpha_2}{\alpha_2} \cdot \phi_1 = \left(\frac{\alpha_1}{\alpha_2} - 1\right) \cdot \phi_1 = \frac{\alpha_1}{\alpha_2} \cdot \phi_1 - \phi_1 \qquad \text{Equation 2}$$

The $\Delta\phi$ value is then maintained as constant and added by summer 104 via line 128 to the phase error samples throughout the subsequent tracking mode operation while TRK signal 122 is a logic high. When the PLL is in the acquisition mode which is the default mode, the TRK signal 122 goes to a logic low condition and summer 104 does not add anything to the phase error signal 102 since the output of asynchronous flip-flop 120 is zero.

Multiplier 106 during the PLL frequency/phase acquisition mode multiplies the output from summer 104 with $\alpha_1$ coming from input 112 via line 130. During the tracking mode, multiplier 106 multiplies the output of summer 104 with $\alpha_2$ coming from input 114. The TRK signal 122 controls the multiplexer and determines which of the loop gain parameters, $\alpha_1$ or $\alpha_2$, is presented to multiplier 106. The output of multiplier 106 then becomes the tuning word for DCO 108.

It is very advantageous to restrict the ratio of normalized loop gains ($\alpha_1/\alpha_2$) to power-of-two values, such that Equation 2 simply reduces to a left bit-shift operation of the phase error just before the gear-shift instance $\phi_1$ minus $\phi_1$ itself.

It should be noted that the "effective" center frequency, $f_{0,eff}$ in the tracking mode is now much closer to the desired frequency than the "raw" oscillator center frequency, $f_0$, at the beginning of the acquisition-mode of operation. The effective center frequency can be calculated as follows:

$$f_{0,eff} = f_0 + \Delta\phi \cdot \alpha_2 \cdot K_{DCO} \qquad \text{Equation 3}$$

This method of gear-shifting of the PLL loop gain can be naturally extended to the sequential reduction of three or more loop gain parameters ($\alpha$) as discussed in this preferred embodiment. With each reduction of $\alpha$, as the loop gets closer to the desired frequency, the frequency dynamic range is reduced, but the frequency resolution becomes finer.

Figure 3:
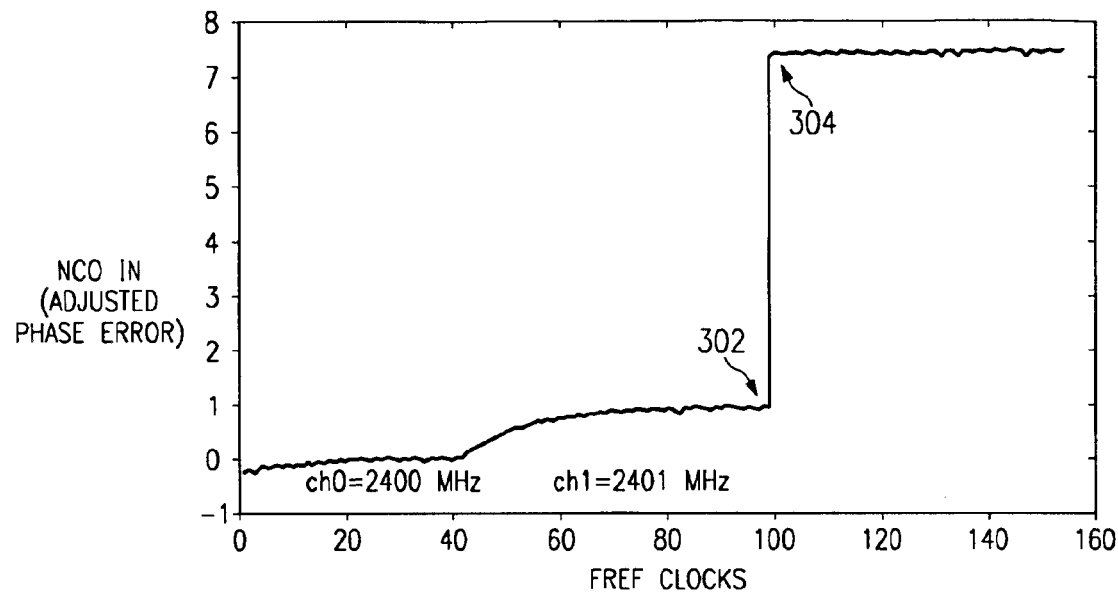
FIG. 3 shows a simulation result for the fixed-point normalized phase error [φ(k)] that is an input to the DCO gain stage in accordance with the invention.

Referring now to FIG. 3, simulation results of the ADPLL of FIG. 1 channel-hopping and loop gain switching (gear shifting) operations is shown. FIG. 3 shows the fixed-point normalized phase error $\phi$, which is an input to the DCO gain block. Region 302 is where $\alpha_1$ is equal to 0.08 and region 304 is where $\alpha_2$ is equal to 0.01.

Figure 4:
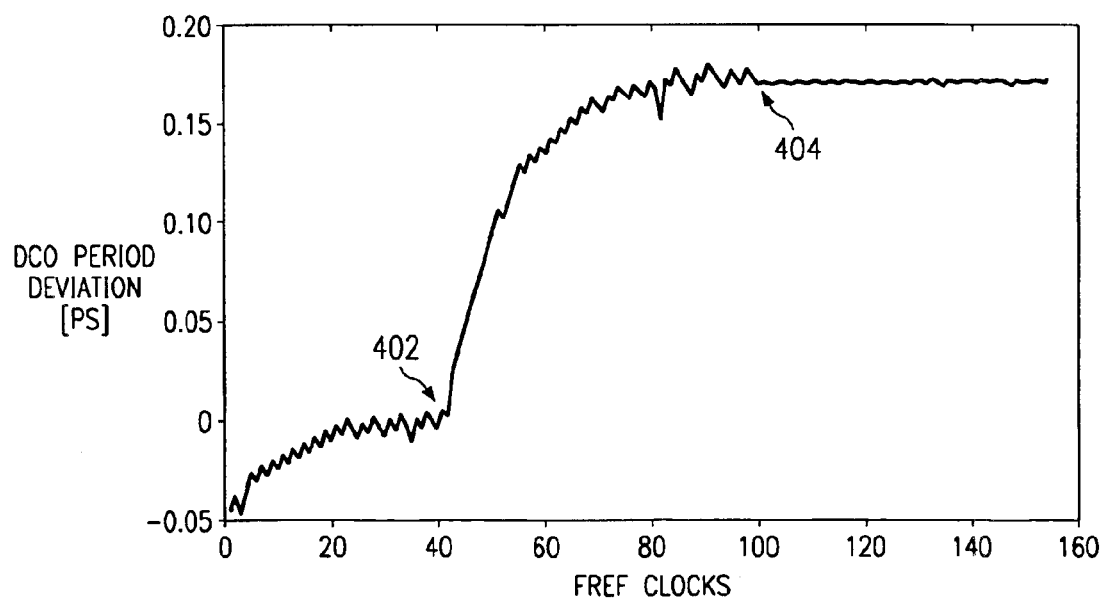
FIG. 4 shows a simulation result for the corresponding instantaneous DCO period deviation that is proportional to the frequency deviation.

In FIG. 4, there is shown the corresponding instantaneous DCO period deviation from the DCO center frequency where, $\alpha_1=0.08$, $\alpha_2=0.01$, $\Delta t_{res}=30$ ps (picoseconds) and $\Delta f_{LSB}=5.76$ kHz.

Instantaneous period deviation is shown in the vertical axis in FIG. 4 in picosecond (ps) units. The horizontal axis is time in the 13-megahertz (MHz) frequency reference ($F_{ref}$) clock count units. Point 402 is a channel hop at 40, while point 404 is a gear shift at 100 from acquisition to tracking.

The DCO frequency deviation, $\Delta f$, from the center frequency, $f_0$, is related to the DCO period deviation, $\Delta T$, as shown in Equation 4 as follows:

$$\Delta f = \Delta T/T_0^2 = \Delta T \cdot f_0^2 \qquad \text{Equation 4}$$

Due to the fact that the simulator used to perform the simulations shown in FIGS. 3 and 4 has an inherent 1 fs timing resolution (the finest time resolution specified by the VHDL standard), the oscillator frequency granularity is established based on the integer multiples of the 1 fs time unit. Therefore, $\Delta T_{LSB}$ of 1 fs timing period granularity step used in the simulation corresponds to $\Delta f_{LSB}$ of 5,760 Hz frequency granularity step. The fractional phase detector resolution, $\Delta t_{res}$, is 30 ps, which is achievable using submicron CMOS semiconductor processes.

Initially, the PLL loop operates at channel 0 (2400 MHz) of the BLUETOOTH band. At time equal 40, a new value of the division ratio that corresponds to channel 1 (2401 MHz) is entered. The loop quickly acquires the new frequency with the loop gain of $\alpha=0.08$. At time 100, after the steady-state acquisition is reached, the PLL loop transitions into the tracking mode with a reduced loop gain of $\alpha=0.01$. The reduced loop bandwidth exhibits itself as a smoother and more stable DCO frequency deviation curve. During the gear-shifting switch, the amount of the phase error or DCO input has to jump as shown in FIG. 3 such that the instantaneous DCO period is maintained as shown in FIG. 4.

The proposed loop gain constant "gear-shift" scheme of the present invention is preferably self contained in the DCO gain block. An improvement could be further made to the DCO operational range; however, which would require some modifications to either or both sources of the phase error signal, reference phase $R_R$ and variable phase $R_V$. Since $R_R$ operates at a much lower frequency than $R_V$ it is much easier in practice to perform any phase adjustment to the reference phase accumulator.

Since the loop gain switching operation is hitless the frequency range would be proportionally lower with the new $\alpha$, there is also no perturbation to the uncorrected phase error $\phi$ (from the phase detector). If the phase error value is at the maximum of the dynamic range at the end of the acquisition, it will remain there during tracking. The frequency range would be proportionally lower with the new $\alpha$ but the new "effective" center frequency is now closer to the desired frequency. The main idea behind the improved scheme is to make the effective center frequency after the loop gain shifting to be exactly zero by an appropriate adjustment of the DC phase error correction $\Delta\phi$ and either the reference phase $R_R$ or the DCO phase $R_V$.

The above noted zero-phase restart could be simply implemented as performing the following steps during the loop gain shifting operation:

1. Make $R_R$ equal to $R_V$ (or vice-versa, but this would not be as advantageous) in order to bring $\phi_2$ to zero just after the gear shift instance. This can be achieved by loading the variable accumulator value $R_V$ into the reference register $R_R$ during the gear-shift clock cycle and performing the regular adjustment by the frequency control word (FCW). The phase error value $\phi_2$ would not be zero, but would be equal to FCW as normally expected follow-up to zero at the next clock cycle.

2. Modify $\Delta\phi$ of the original method as now expressed in equation 5 below:

$$\Delta\phi=(\alpha_1/\alpha_2)*\phi_1 \quad \text{Equation 5}$$

Figure 5:
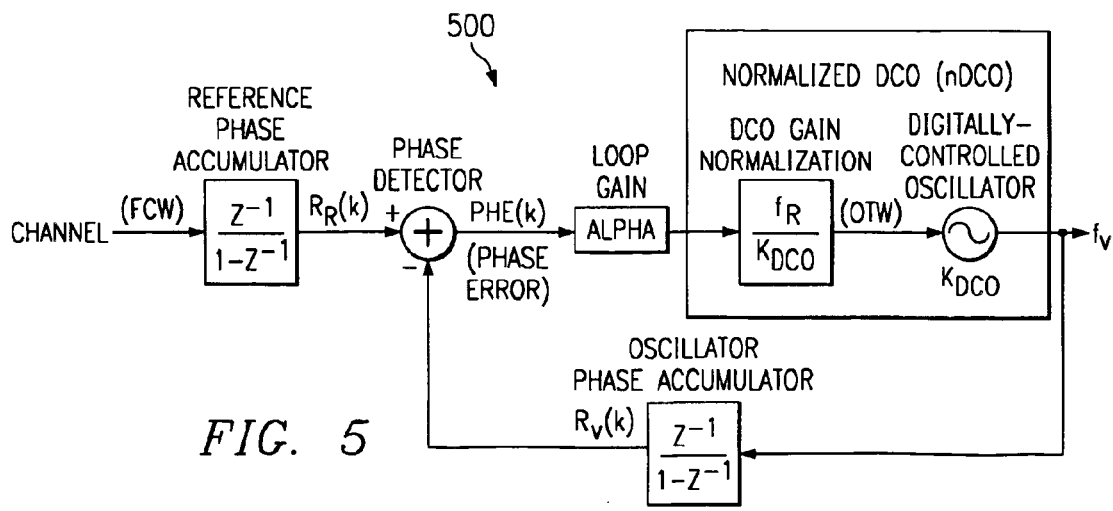
FIG. 5 shows an all-digital PLL architecture in accordance with one embodiment of the invention.

It is very advantageous to restrict the acquisition-to-tracking normalized loop gain ratio ($\alpha_1/\alpha_2$) to power-of-two values such that equation 5 simply reduces to the left bit-shift operation of the phase error $\phi$. An all-digital PLL (ADPLL) 500 incorporating such a design is shown in FIG. 5. It should be noted that this improved method could be adapted to work for a higher-order PLL loop. In which case, the loop filter integrator would additionally have to be reset.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims. For example, although the present invention makes implementation sense mainly in digital systems, given that it is generally difficult to perform PLL gear shifting in analog circuits because of the imperfect matching and voltage or charge losses during switching, resulting in phase hits, the gear shifting of the present invention can still be used in some analog designs.

What is claimed:

1. A method of adjusting a loop gain constant in a phase-lock loop (PLL) synthesizer having a controllable oscillator, comprising the steps of:
   (a) using a first PLL loop gain constant ($\alpha_1$) during a phase/frequency acquisition mode of the PLL synthesizer; and
   (b) performing the following two steps when the PLL synthesizer transitions from the phase/frequency acquisition mode into a tracking mode:
      (b1) adding a DC offset to the PLL synthesizer's controlled oscillator-tuning signal; and
      (b2) changing the first PLL loop gain constant ($\alpha_1$) to a second PLL loop gain constant ($\alpha_2$) which is smaller in value than the first PLL loop gain constant ($\alpha_1$).

2. A method as defined in claim 1, wherein the PLL synthesizer comprises a digital PLL synthesizer.

3. A method as defined in claim 1, wherein a normalized loop gain ratio ($\alpha_1/\alpha_2$) is restricted to power-of-two values.

4. A method as defined in claim 1, wherein steps (b1) and (b2) are performed during the same clock cycle.

5. A method as defined in claim 2, wherein the PLL synthesizer has a phase detector that provides a phase error comprising a reference phase $R_R$, and a variable phase $R_V$ and comprising the further step of:
   (c) making $R_R$ equal to $R_V$ in order to bring an uncorrected phase error ($\phi$) provided by a phase detector equal to zero.

6. A method as defined in claim 5, wherein the DC offset added in step (b1) is equal to $(\alpha_1/\alpha_2)*\phi_1$, wherein ($\phi_1$) is a value of the uncorrected phase error ($\phi$) provided by the phase detector at the instance the phase detector goes from the phase acquisition mode to the tracking mode (gear shift).

7. A method as defined in claim 5, wherein step 5(c) is performed in the same clock cycle as steps (b1) and (b2).

8. A method as defined in claim 5, wherein step (c) is performed by loading the variable phase ($R_V$) value into a reference register used to store the reference phase ($R_R$) value.

9. A method as defined in claim 8, wherein step (c1) is performed during the same clock cycle as steps (b1) and (b2).

10. A method as defined in claim 9, further comprising the step of:
    (d) performing a regular adjustment using a frequency control word (FCW).

11. A method as defined in claim 1, wherein in step (b1) the PLL synthesizer's controlled oscillator-tuning signal comprises a phase error signal provided by a phase detector.

12. A method as defined in claim 11, wherein the DC offset added in step (b1) equals $\Delta\phi=[(\alpha_1/\alpha_2)-1]*\phi_1$, wherein ($\phi_1$) is a value of the uncorrected phase error signal provided by the phase detector at the instance the phase detector goes from the phase acquisition mode to the tracking mode (gear shift).

13. A PLL synthesizer, comprising:
    a phase detector for providing an uncorrected phase error signal ($\phi$) having a value at an instance the phase detector goes from the phase acquisition mode to the tracking mode (gear shift) of ($\phi_1$);
    an oscillator having an input;
    a calculation circuit for calculating an offset adjustment value ($\Delta\phi$) which is equal to $(\alpha_1/\alpha_2-1)*\phi_1$, where ($\alpha_1$) is a first PLL loop gain constant and ($\alpha_2$) is a second PLL loop gain constant which is smaller in value than the first PLL loop gain constant ($\alpha_1$);
    a summing circuit coupled to the phase detector for adding the uncorrected phase error signal with a phase error adjustment value and providing it as a summation circuit output signal; and
    a multiplier circuit for multiplying the summation circuit output signal with either the first ($\alpha_1$) or second ($\alpha_2$) PLL loop gain constant and providing the result as a multiplier output signal that is provided to the input of the oscillator as a tuning word.

14. A PLL synthesizer as defined in claim 13, wherein the multiplier multiplies the summation circuit output signal with the second PLL loop gain constant upon the PLL synthesizer moving from a phase/frequency acquisition mode to a tracking mode.

15. A PLL synthesizer as defined in claim 14, wherein a normalized loop gain ($\alpha_1/\alpha_2$) comprises a power-of-two value.

16. A PLL synthesizer as defined in claim 14, wherein the uncorrected phase error signal ($\phi$) provided by the phase detector includes a reference phase ($R_R$), and a variable phase ($R_V$) and further comprising:
    a reference register used to store the value of the reference phase ($R_R$), and the value of the variable phase ($R_V$) is loaded in the reference register in order to bring the uncorrected phase error equal to zero.

17. A PLL synthesizer as defined in claim 16, wherein a regular adjustment is performed using a frequency control word (FCW).

* * * * *